United States Patent
Hara et al.

(10) Patent No.: US 9,736,929 B2
(45) Date of Patent: Aug. 15, 2017

(54) TRANSPARENT CONDUCTIVE LAMINATE AND ELECTRONIC DEVICE OR MODULE

(71) Applicant: LINTEC Corporation, Tokyo (JP)

(72) Inventors: Tsutomu Hara, Tokyo (JP); Yuuta Suzuki, Tokyo (JP); Koichi Nagamoto, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 383 days.

(21) Appl. No.: 14/386,421

(22) PCT Filed: Mar. 21, 2013

(86) PCT No.: PCT/JP2013/058139
§ 371 (c)(1),
(2) Date: Sep. 19, 2014

(87) PCT Pub. No.: WO2013/141318
PCT Pub. Date: Sep. 26, 2013

(65) Prior Publication Data
US 2015/0049440 A1    Feb. 19, 2015

(30) Foreign Application Priority Data

Mar. 22, 2012    (JP) ................. 2012-065135

(51) Int. Cl.
| H05K 1/02 | (2006.01) |
| G06F 3/041 | (2006.01) |
| H05K 1/03 | (2006.01) |
| C04B 35/453 | (2006.01) |
| G02F 1/1343 | (2006.01) |

(52) U.S. Cl.
CPC ......... *H05K 1/0274* (2013.01); *C04B 35/453* (2013.01); *G06F 3/041* (2013.01); *H05K 1/0353* (2013.01); *C04B 2235/3284* (2013.01); *C04B 2235/3286* (2013.01); *G02F 1/13439* (2013.01); *H05K 2201/0326* (2013.01); *Y10T 428/24942* (2015.01)

(58) Field of Classification Search
CPC .......... H05K 1/0274; Y10T 428/24802; Y10T 428/24942; G06F 3/041
See application file for complete search history.

(56) References Cited

U.S. PATENT DOCUMENTS

| 2006/0214925 A1* | 9/2006 | Taninaka ............... G06F 3/0412 |
| | | 345/173 |
| 2008/0226924 A1 | 9/2008 | Okubo et al. |
| 2009/0208715 A1 | 8/2009 | Stowell et al. |
| 2012/0028013 A1* | 2/2012 | Matsuda ............... G02B 5/3058 |
| | | 428/213 |

FOREIGN PATENT DOCUMENTS

| EP | 1731299 A1 | 12/2006 |
| JP | 2004-152727 A | 5/2004 |
| JP | 2008-21605 A | 1/2008 |
| JP | 2009-283348 A | 12/2009 |
| JP | 2010-184478 A | 8/2010 |
| JP | 2012-22460 A | 2/2012 |
| JP | 2012-101544 A | 5/2012 |
| TW | 201208873 A1 | 3/2012 |
| WO | WO 2005/097484 A1 | 10/2005 |
| WO | WO 2011/142454 A1 | 11/2011 |

OTHER PUBLICATIONS

Extended European Search Report, dated Sep. 15, 2015, for European Application No. 13764543.8.
International Search Report, issued in PCT/JP2013/058139, dated Jun. 25, 2013.
Office Action issued in Taiwanese Patent Application No. 102109978 dated Dec. 7, 2016 (with English-Language Translation).

* cited by examiner

Primary Examiner — Gerard Higgins
(74) Attorney, Agent, or Firm — Birch, Stewart, Kolasch & Birch, LLP

(57) ABSTRACT

The present invention is a transparent conductive laminate comprising a base, a low-refractive-index layer, an intermediate-refractive-index layer, and a transparent conductive layer, the low-refractive-index layer, the intermediate-refractive-index layer, and the transparent conductive layer being sequentially stacked on at least one side of the base either directly or through one or more layers, the low-refractive-index layer having a refractive index of 1.40 to 1.50, and the intermediate-refractive-index layer having a refractive index of 1.50 to 1.80 and a film density of 2.5 to 4.5 g/cm$^3$. The present invention provides a transparent conductive laminate that exhibits excellent moisture-heat resistance and excellent optical properties, and an electronic device or module.

13 Claims, No Drawings

TRANSPARENT CONDUCTIVE LAMINATE AND ELECTRONIC DEVICE OR MODULE

TECHNICAL FIELD

The invention relates to a transparent conductive laminate that exhibits excellent moisture-heat resistance and excellent optical properties, and an electronic device or module that utilizes the transparent conductive laminate.

BACKGROUND ART

Use of a transparent plastic film instead of a glass sheet (plate) has been studied for an electronic member used for liquid crystal displays, electroluminescence (EL) displays, touch panels, and the like in order to implement a reduction in thickness, a reduction in weight, an increase in flexibility, and the like.

However, a plastic film easily allows water vapor, oxygen, and the like to pass through as compared with a glass sheet, and may easily cause a deterioration in elements provided in an electronic member.

An electronic member used for image displays and the like is normally required to have a high total light transmittance and a natural color tone. However, when a conductive layer is formed using indium tin oxide (ITO) or the like, yellowness may be enhanced due to the conductive layer.

In order to solve the above problems, Patent Document 1 proposes a film that includes a transparent base and a transparent conductive film, has an extinction coefficient of 0.05 or less with respect to a beam having a wavelength of 550 nm, and has a yellowness index (YI) of 0.5 to 3.0. However, the film obtained in the examples of Patent Document 1 exhibits unsatisfactory moisture-heat resistance and optical properties, and a further improvement in performance has been desired.

RELATED-ART DOCUMENT

Patent Document

Patent Document 1: JP-A-2008-21605

SUMMARY OF THE INVENTION

Technical Problem

The invention was conceived in view of the above situation. An object of the invention is to provide a transparent conductive laminate that exhibits excellent moisture-heat resistance and excellent optical properties, and an electronic device or module that utilizes the transparent conductive laminate.

Solution to Problem

The inventors of the invention conducted extensive studies in order to achieve the above object. As a result, the inventors found that a transparent conductive laminate in which a low-refractive-index layer, an intermediate-refractive-index layer, and a transparent conductive layer are sequentially stacked on at least one side of a base either directly or through one or more layers, wherein the low-refractive-index layer has a refractive index within a specific range, and the intermediate-refractive-index layer has a refractive index within a specific range and a film density within a specific range, exhibits excellent moisture-heat resistance, shows a small degree of yellowness, and exhibits excellent optical properties. This finding has led to the completion of the invention.

The invention provides the following transparent conductive laminate (see (1) to (6)) and the like.

(1) A transparent conductive laminate including a base, a low-refractive-index layer, an intermediate-refractive-index layer, and a transparent conductive layer, the low-refractive-index layer, the intermediate-refractive-index layer, and the transparent conductive layer being sequentially stacked on at least one side of the base either directly or through one or more layers, the low-refractive-index layer having a refractive index of 1.40 to 1.50, and the intermediate-refractive-index layer having a refractive index of 1.50 to 1.80 and a film density of 2.5 to 4.5 g/cm$^3$.

(2) The transparent conductive laminate according to (1), wherein the intermediate-refractive-index layer has an optical thickness of 1 to 100 nm.

(3) The transparent conductive laminate according to (1), wherein the low-refractive-index layer has an optical thickness of 10 to 800 nm.

(4) The transparent conductive laminate according to (1), wherein the transparent conductive layer has an optical thickness of 10 to 250 nm.

(5) The transparent conductive laminate according to (1), the transparent conductive laminate having a water vapor transmission rate at a temperature of 40° C. and a relative humidity of 90% of 0.1 g/m$^2$/day or less.

(6) The transparent conductive laminate according to (1), the transparent conductive laminate having a transmission hue b* value of −2.0 to +2.0 and a total light transmittance of 80% or more.

(7) The transparent conductive laminate according to (1), wherein a material that forms the transparent conductive layer is at least one material selected from the group consisting of zinc oxide, gallium-doped zinc oxide (GZO), aluminum-doped zinc oxide (AZO), and indium zinc oxide (IZO).

(8) The transparent conductive laminate according to (1), wherein the intermediate-refractive-index layer and the low-refractive-index layer are obtained by subjecting a silicon-based polymer layer to an ion implantation treatment.

(7) An electronic device or module including the transparent conductive laminate according to any one of (1) to (6).

Advantageous Effects of the Invention

Since the transparent conductive laminate according to one aspect of the invention exhibits excellent moisture-heat resistance, shows a small degree of yellowness, and exhibits excellent optical properties, the transparent conductive laminate is suitable as an electronic member used for image displays such as a liquid crystal display, an electroluminescence (EL) display, and a touch panel.

Since the electronic device or module according to one aspect of the invention utilizes the transparent conductive laminate according to one aspect of the invention, the electronic device or module exhibits excellent moisture-heat resistance, shows a small degree of yellowness, and exhibits excellent optical properties.

DESCRIPTION OF EMBODIMENTS

A transparent conductive laminate according to one embodiment of the invention includes a base, a low-refractive-index layer, an intermediate-refractive-index layer, and a transparent conductive layer, the low-refractive-index layer, the intermediate-refractive-index layer, and the transparent conductive layer being sequentially stacked on at least one side of the base either directly or through one or more layers, the low-refractive-index layer having a refractive index of 1.40 to 1.50, and the intermediate-refractive-index layer having a refractive index of 1.50 to 1.80 and a film density of 2.5 to 4.5.

Base

The base used in connection with one embodiment of the invention is not particularly limited as long as the base is colorless and transparent, and has a strength sufficient for the transparent conductive laminate.

Examples of a material for forming the base include polyimides, polyamides, polyamide-imides, polyphenylene ethers, polyether ketones, polyether ether ketones, polyolefins, polyesters, polycarbonates, polysulfones, polyether sulfones, polyphenylene sulfides, polyarylates, acrylic-based resins, cycloolefin-based polymers, aromatic-based polymers, polyurethane-based polymers, and the like.

Among these, polyesters, polyamides, and cycloolefin-based polymers are preferable, and polyesters and cycloolefin-based polymers are more preferable, due to excellent transparency and versatility.

Examples of the polyesters include polyethylene terephthalate, polybuthylene terephthalate, polyethylene naphthalate, polyarylate, and the like.

Examples of the polyamides include wholly aromatic polyamides, nylon 6, nylon 66, nylon copolymers, and the like.

Examples of the cycloolefin-based polymers include norbornene-based polymers, monocyclic olefin-based polymers, cyclic conjugated diene-based polymers, vinyl alicyclic hydrocarbon-based polymers, and hydrogenated products thereof. Specific examples of the cycloolefin-based polymers include APEL (ethylene-cycloolefin copolymer manufactured by Mitsui Chemicals Inc.), ARTON (norbornene-based polymer manufactured by JSR Corporation), ZEONOR (norbornene-based polymer manufactured by Zeon Corporation), and the like.

Among these, polyesters such as polyethylene terephthalate, polybutylene terephthalate, polyethylene naphthalate, and polyarylate are preferable, and polyethylene terephthalate is more preferable, from the viewpoint of versatility and cost.

The base may include various additives such as an antioxidant, a flame retardant, and a lubricant in addition to the resin component as long as the transparency and the like are not impaired.

The thickness of the base is normally 0.01 to 0.5 mm, and preferably 0.05 to 0.25 mm. When the thickness of the base is within the above range, it is possible to easily obtain a transparent conductive laminate that exhibits excellent transparency and flexibility.

The total light transmittance of the base is preferably 70% or more, more preferably 70 to 100%, and still more preferably 80 to 95%. The haze value of the base is preferably 10% or less, and more preferably 1 to 10%. When the total light transmittance and the haze value of the base are within the above ranges, it is possible to easily obtain a transparent conductive laminate that exhibits excellent transparency.

The refractive index of the base is normally 1.45 to 1.75, and preferably 1.6 to 1.75 (depending on the material and the presence or absence of stretching), from the viewpoint of transparency.

Low-Refractive-Index Layer

The low-refractive-index layer used for the transparent conductive laminate according to one embodiment of the invention is a layer that has a refractive index of 1.40 to 1.50, and preferably 1.42 to 1.48. A transparent conductive laminate that exhibits excellent optical properties (i.e., total light transmittance and color tone) can be obtained by utilizing the low-refractive-index layer having the above properties in combination with the intermediate-refractive-index layer (described later).

The optical thickness of the low-refractive-index layer is normally 10 to 800 nm, and preferably 100 to 500 nm. When the optical thickness of the low-refractive-index layer is within the above range, it is possible to obtain a transparent conductive laminate that exhibits excellent optical properties, and has a reduced thickness. Note that the term "optical thickness" used herein in connection with a layer refers to the product (n×d) of the refractive index (n) and the thickness (d) of the layer.

The low-refractive-index layer may include an arbitrary component, and may be formed using an arbitrary method as long as the low-refractive-index layer has the above properties. A known material and a known method may be used to form the low-refractive-index layer. Examples of the material for forming the low-refractive-index layer include silicon-based polymer compounds; photopolymerizable compositions that include a photopolymerizable compound produced using a photopolymerizable monomer and/or a photopolymerizable prepolymer, and a photoinitiator; resins such as a polyester-based resin, a polyurethane-based resin (particularly a two-component curable resin that includes an isocyanate compound and a polyacrylic polyol, a polyester polyol, a polyether polyol, or the like), an acrylic-based resin, a polycarbonate-based resin, a vinyl chloride/vinyl acetate copolymer, a polyvinyl butyral-based resin, and a nitrocellulose-based resin; alkyl titanates; ethyleneimine; fluororesins; and the like. These materials may be used either alone or in combination. It is preferable that the low-refractive-index layer be formed of a silicon-based polymer compound (hereinafter may be referred to as "silicon-based polymer layer"). Note that part of the silicon-based polymer layer can be modified by subjecting the surface of the silicon-based polymer layer to an ion implantation treatment (e.g., plasma ion implantation treatment) (described later) to easily form an intermediate-refractive-index layer having the desired properties. Specifically, the modified part (hereinafter may be referred to as "surface layer part") serves as an intermediate-refractive-index layer having the desired properties, and the unmodified part serves as a low-refractive-index layer. Therefore, a transparent conductive laminate can be efficiently obtained by utilizing the silicon-based polymer layer as the low-refractive-index layer.

The silicon-based polymer compound may be either an organic compound or an inorganic compound as long as the silicon-based polymer compound is a polymer that includes silicon. Examples of the silicon-based polymer compound include a polyorganosiloxane-based compound, a polycarbosilane-based compound, a polysilane-based compound, a polysilazane-based compound, and the like.

The polyorganosiloxane-based compound is obtained by polycondensing a silane compound that includes a hydrolyzable functional group.

The main chain structure of the polyorganosiloxane-based compound is not particularly limited. The main chain structure of the polyorganosiloxane-based compound may be linear, ladder-like, or polyhedral.

Examples of the linear main chain structure of the polyorganosiloxane compound include a structure represented by the following formula (a). Examples of the ladder-like main chain structure of the polyorganosiloxane compound include a structure represented by the following formula (b). Examples of the polyhedral main chain structure of the polyorganosiloxane compound include a structure represented by the following formula (c).

atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Among these, a hydrogen atom, an alkyl group having 1 to 6 carbon atoms, or a phenyl group is preferable, and an

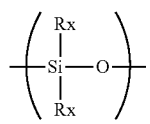

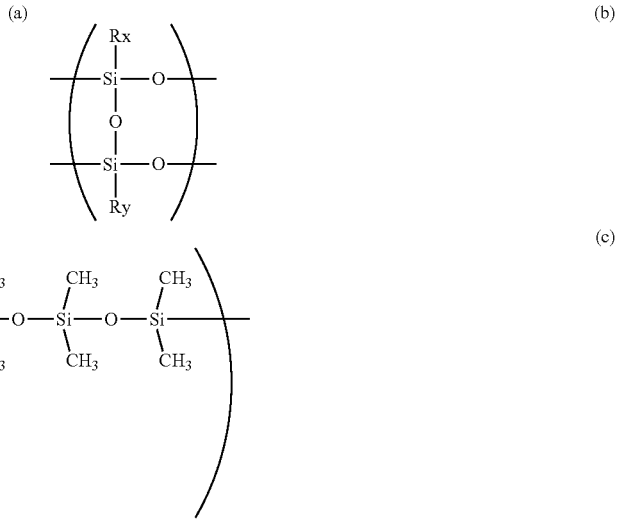

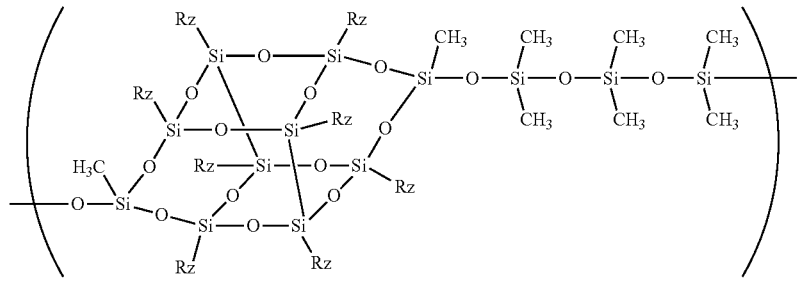

wherein Rx, Ry, and Rz are independently a hydrogen atom or a non-hydrolyzable group such as a substituted or unsubstituted alkyl group, a substituted or unsubstituted alkenyl group, or a substituted or unsubstituted aryl group. Note that a plurality of Rx in the formula (a), a plurality of Ry in the formula (b), and a plurality of Rz in the formula (c) may respectively be either identical or different, provided that a case where both Rx in the formula (a) are a hydrogen atom is excluded.

Examples of the unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the unsubstituted alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group and a substituent that may substitute the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the unsubstituted aryl group include aryl groups having 6 to 10 carbon atoms (e.g., phenyl group, 1-naphthyl group, and 2-naphthyl group).

Examples of a substituent that may substitute the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon alkyl group having 1 to 6 carbon atoms is particularly preferable as Rx, Ry, and Rz.

The polyorganosiloxane-based compound is preferably a linear compound represented by the formula (a), and more preferably a polydimethylsiloxane represented by the formula (a) in which both Rx are a methyl group, from the viewpoint of availability and a capability to form a layer that exhibits an excellent gas barrier capability.

The polyorganosiloxane-based compound may be obtained by a known production method that polycondenses a silane compound that includes a hydrolyzable functional group, for example.

The silane compound used to produce the polyorganosiloxane-based compound may be appropriately selected depending on the structure of the target polyorganosiloxane-based compound. Specific examples of a preferable silane compound include bifunctional silane compounds such as dimethyldimethoxysilane, dimethyldiethoxysilane, diethyldimethoxysilane, and diethyldiethoxysilane; trifunctional silane compounds such as methyltrimethoxysilane, methyltriethoxysilane, ethyltrimethoxysilane, ethyltriethoxysilane, n-propyltrimethoxysilane, n-butyltriethoxysilane, phenyltrimethoxysilane, phenyltriethoxysilane, and phenyldiethoxymethoxysilane; tetrafunctional silane compounds such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane, and trimethoxyethoxysilane; and the like.

The term "polycarbosilane-based compound" used herein refers to a polymer compound that includes an —Si—C— bond in the main chain of the molecule. A compound that includes a repeating unit represented by the following formula (d) is preferable as the polycarbosilane-based compound.

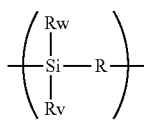

(d)

wherein Rw and Rv are independently a hydrogen atom, a hydroxyl group, an alkyl group, an aryl group, an alkenyl group, or a monovalent heterocyclic group, provided that a plurality of Rw and a plurality of Rv are respectively either identical or different.

Examples of the alkyl group, the aryl group, and the alkenyl group represented by Rw and Rv include those mentioned above in connection with Rx and the like.

The heterocyclic ring of the monovalent heterocyclic group is not particularly limited as long as the heterocyclic ring is derived from a 3 to 10-membered cyclic compound that includes a carbon atom and at least one heteroatom (e.g., oxygen atom, nitrogen atom, or sulfur atom).

Specific examples of the monovalent heterocyclic group include a 2-pyridyl group, a 3-pyridyl group, a 4-pyridyl group, a 2-thienyl group, a 3-thienyl group, a 2-furyl group, a 3-furyl group, a 3-pyrazolyl group, a 4-pyrazolyl group, a 2-imidazolyl group, a 4-imidazolyl group, a 1,2,4-triazin-3-yl group, a 1,2,4-triazin-5-yl group, a 2-pyrimidyl group, a 4-pyrimidyl group, a 5-pyrimidyl group, a 3-pyridazyl group, a 4-pyridazyl group, a 2-pyrazyl group, a 2-(1,3,5-triazyl) group, a 3-(1,2,4-triazyl) group, a 6-(1,2,4-triazyl) group, a 2-thiazolyl group, a 5-thiazolyl group, a 3-isothiazolyl group, a 5-isothiazolyl group, a 2-(1,3,4-thiadiazolyl) group, a 3-(1,2,4-thiadiazolyl) group, a 2-oxazolyl group, a 4-oxazolyl group, a 3-isoxazolyl group, a 5-isoxazolyl group, a 2-(1,3,4-oxadiazolyl) group, a 3-(1,2,4-oxadiazolyl) group, a 5-(1,2,3-oxadiazolyl) group, and the like.

These groups may be substituted with a substituent (e.g., alkyl group, aryl group, alkoxy group, or aryloxy group) at an arbitrary position.

R is an alkylene group, an arylene group, or a divalent heterocyclic group.

Examples of the alkylene group represented by R include alkylene groups having 1 to 10 carbon atoms, such as a methylene group, an ethylene group, a propylene group, a trimethylene group, a tetramethylene group, a pentamethylene group, a hexamethylene group, and an octamethylene group.

Examples of the arylene group include arylene groups having 6 to 20 carbon atoms, such as a phenylene group, a 1,4-naphthylene group, and a 2,5-naphthylene group.

The divalent heterocyclic group is not particularly limited as long as the divalent heterocyclic group is a divalent group derived from a 3 to 10-membered cyclic compound that includes a carbon atom and at least one heteroatom (e.g., oxygen atom, nitrogen atom, or sulfur atom).

Specific examples of the divalent heterocyclic group include a thiophenediyl group such as a 2,5-thiophenediyl group; a furandiyl group such as a 2,5-furandiyl group; a selenophenediyl group such as a 2,5-selenophenediyl group; a pyrrolediyl group such as a 2,5-pyrrolediyl group; a pyridinediyl group such as a 2,5-pyridinediyl group and a 2,6-pyridinediyl group; a thienothiophenediyl group such as a 2,5-thieno[3,2-b]thiophenediyl group and a 2,5-thieno[2,3-b]thiophenediyl group; a quinolinediyl group such as a 2,6-quinolinediyl group; an isoquinolinediyl group such as a 1,4-isoquinolinediyl group and a 1,5-isoquinolinediyl group; a quinoxalinediyl group such as a 5,8-quinoxalinediyl group; a benzo[1,2,5]thiadiazolediyl group such as a 4,7-benzo[1,2,5]thiadiazolediyl group, a benzothiazolediyl group such as a 4,7-benzothiazolediyl group; a carbazolediyl group such as a 2,7-carbazolediyl group and a 3,6-carbazolediyl group; a phenoxazinediyl group such as a 3,7-phenoxazinediyl group; a phenothiazinediyl group such as a 3,7-phenothiazinediyl group; a dibenzosilolediyl group such as a 2,7-dibenzosilolediyl group; a benzodithiophenediyl group such as a 2,6-benzo[1,2-b:4,5-b']dithiophenediyl group, 2,6-benzo[1,2-b:5,4-b']dithiophenediyl group, 2,6-benzo[2,1-b:3,4-b']dithiophenediyl group, 2,6-benzo[1,2-b:3,4-b']dithiophenediyl group; and the like.

The alkylene group, the arylene group, and the divalent heterocyclic group represented by R may be substituted with a substituent (e.g., alkyl group, aryl group, alkoxy group, or halogen atom) at an arbitrary position.

It is preferable to use a polycarbosilane-based compound that includes the repeating unit represented by the formula (d) in which Rw and Rv are independently a hydrogen atom, an alkyl group, or an aryl group, and R is an alkylene group or an arylene group. It is more preferable to use a polycarbosilane-based compound that includes the repeating unit represented by the formula (d) in which Rw and Rv are independently a hydrogen atom or an alkyl group, and R is an alkylene group.

The weight average molecular weight of the polycarbosilane-based compound that includes the repeating unit represented by the formula (d) is normally 400 to 12,000.

The polycarbosilane-based compound may be produced using an arbitrary known method. For example, the polycarbosilane-based compound may be produced using a method that produces a polycarbosilane-based compound by thermal decomposition and polymerization of a polysilane (JP-A-51-126300), a method that produces a polycarbosilane-based compound by thermal rearrangement of poly(dimethylsilane) (Journal of Materials Science, 2569-2576, Vol. 13, 1978), a method that produces a polycarbosilane-based compound by a Grignard reaction of chloromethyltrichlorosilane (Organometallics, 1336-1344, Vol. 10, 1991), a method that produces a polycarbosilane-based compound by ring-opening polymerization of a disilacyclobutane (Journal of Organometallic Chemistry, 1-10, Vol. 521, 1996), a method that produces a polycarbosilane-based compound by reacting water and/or an alcohol with a raw material polymer that includes a dimethylcarbosilane structural unit and an SiH group-containing silane structural unit in the presence of a basic catalyst (JP-A-2006-117917), a method that produces a polycarbosilane-based compound by polymerizing a carbosilane that includes an organometallic group (e.g., trimethyltin) at the end using an organic main-group metal compound (e.g., n-butyllithium) as an initiator (JP-A-2001-328991), or the like.

The term "polysilane-based compound" used herein refers to a polymer compound that includes an —Si—Si— bond in the molecule. Examples of the polysilane-based compound include a compound that includes at least one repeating unit selected from structural units represented by the following formula (e).

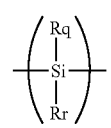

(e)

wherein Rq and Rr are independently a hydrogen atom, an alkenyl group, a cycloalkyl group, a cycloalkenyl group, an aryl group, a hydroxyl group, an alkoxy group, a cycloalkyloxy group, an aryloxy group, an aralkyloxy group, a substituted or unsubstituted amino group, a silyl group, or a halogen atom.

Examples of the alkyl group, the alkenyl group, and the aryl group represented by Rq and Rr include those mentioned above in connection with Rx and the like.

Examples of the cycloalkyl group include cycloalkyl groups having 3 to 10 carbon atoms, such as a cyclopentyl group, a cyclohexyl group, and a methylcyclohexyl group.

Examples of the cycloalkenyl group include cycloalkenyl groups having 4 to 10 carbon atoms, such as a cyclopentenyl group and a cyclohexenyl group.

Examples of the alkoxy group include alkoxy groups having 1 to 10 carbon atoms, such as a methoxy group, an ethoxy group, a propoxy group, an isopropoxy group, a butoxy group, a t-butoxy group, and a pentyloxy group.

Examples of the cycloalkyloxy group include cycloalkyloxy groups having 3 to 10 carbon atoms, such as a cyclopenthyloxy group and a cyclohexyloxy group.

Examples of the aryloxy group include aryloxy groups having 6 to 20 carbon atoms, such as a phenoxy group and a naphthyloxy group.

Examples of the aralkyloxy group include aralkyloxy groups having 7 to 20 carbon atoms, such as a benzyloxy group, a phenethyloxy group, and a phenylpropyloxy group.

Examples of the substituted or unsubstituted amino group include an amino group; N-monosubstituted or N,N-disubstituted amino groups substituted with an alkyl group, a cycloalkyl group, an aryl group, an aralkyl group, an acyl group, or the like; and the like.

Examples of the silyl group include $Si_{1-10}$ silanyl groups (preferably $Si_{1-6}$ silanyl groups) such as a silyl group, a disilanyl group, and a trisilanyl group, substituted silyl groups (e.g., a substituted silyl group substituted with an alkyl group, a cycloalkyl group, an aryl group, an aralkyl group, an alkoxy group, or the like), and the like.

Examples of the halogen atom include a fluorine atom, a chlorine atom, a bromine atom, an iodine atom, and the like.

The cycloalkyl group, the cycloalkenyl group, the alkoxy group, the cycloalkyloxy group, the aryloxy group, the aralkyloxy group, and the silyl group may be substituted with a substituent (e.g., halogen atom, alkyl group, aryl group, or alkoxy group).

It is preferable to use a polysilane-based compound that includes the repeating unit represented by the formula (e), more preferably a polysilane-based compound that includes the repeating unit represented by the formula (e) in which Rq and Rr are independently a hydrogen atom, a hydroxyl group, an alkyl group, an aryl group, an alkoxy group, an amino group, or a silyl group, and still more preferably a polysilane-based compound that includes the repeating unit represented by the formula (e) in which Rq and Rr are independently a hydrogen atom, an alkyl group, or an aryl group, since more excellent effects can be obtained.

The configuration of the polysilane-based compound is not particularly limited. The polysilane-based compound may be a homopolymer (e.g., noncyclic polysilane (e.g., linear polysilane, branched polysilane, or network polysilane) or cyclic polysilane), or may be a copolymer (e.g., random copolymer, block copolymer, alternating copolymer, or comb-like copolymer).

When the polysilane-based compound is a noncyclic polysilane, the end group (terminal substituent) of the polysilane-based compound may be a hydrogen atom, a halogen atom (e.g., chlorine atom), an alkyl group, a hydroxyl group, an alkoxy group, a silyl group, or the like.

Specific examples of the polysilane-based compound include homopolymers such as a polydialkylsilane such as polydimethylsilane, poly(methylpropylsilane), poly(methylbutylsilane), poly(methylpentylsilane), poly(dibutylsilane), and poly(dihexylsilane), a polydiarylsilane such as poly(diphenylsilane), and a poly(alkylarylsilane) such as poly(methylphenylsilane); copolymers such as a copolymer of a dialkylsilane and another dialkylsilane (e.g., dimethylsilane-methylhexylsilane copolymer), an arylsilane-alkylarylsilane copolymer (e.g., phenylsilane-methylphenylsilane copolymer), and a dialkylsilane-alkylarylsilane copolymer (e.g., dimethylsilane-methylphenylsilane copolymer, dimethylsilane-phenylhexylsilane copolymer, dimethylsilane-methylnaphthylsilane copolymer, and methylpropylsilane-methylphenylsilane copolymer); and the like.

The details of the polysilane-based compound are described in R. D. Miller, J. Michl; Chemical Review, Vol. 89, p. 1359 (1989), N. Matsumoto; Japanese Journal of Physics, Vol. 37, p. 5425 (1998), and the like. The polysilane-based compounds described in these documents may be used as the polysilane-based compound.

The average degree of polymerization (e.g., number average degree of polymerization) of the polysilane-based compound is normally about 5 to about 400, preferably about 10 to about 350, and more preferably about 20 to about 300.

The weight average molecular weight of the polysilane-based compound is about 300 to about 100,000, preferably about 400 to about 50,000, and more preferably about 500 to about 30,000.

A number of polysilane-based compounds are known in the art. Such polysilane-based compounds may be produced by a known method. For example, the polysilane-based compound may be produced by a method that subjects a halosilane to dehalogenation/polycondensation using magnesium as a reducing agent (magnesium reduction method, see WO98/29476, for example), a method that subjects a halosilane to dehalogenation/polycondensation in the presence of an alkali metal (Kipping method, see J. Am. Chem. Soc., 110, 124 (1988), Macromolecules, 23, 3423 (1990), for example), a method that subjects a halosilane to dehalogenation/polycondensation by electrode reduction (see J. Chem. Soc., Chem. Commun., 1161 (1990), J. Chem. Soc., Chem. Commun. 897 (1992), for example), a method that subjects a hydrosilane to dehydrogenation/condensation in the presence of a specific polymerization metal catalyst (see JP-A-4-334551, for example), a method that subjects a disilene crosslinked using a biphenyl or the like to anionic polymerization (see Macromolecules, 23, 4494 (1990), for example), a method that subjects a cyclic silane to ring-opening polymerization, or the like.

The polysilazane-based compound is preferably a compound that includes a repeating unit represented by the following formula (f).

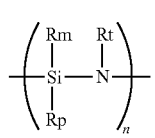

(f)

The number average molecular weight of the polysilazane-based compound is not particularly limited, but is preferably 100 to 50,000.

In the formula (f), n is an arbitrary natural number.

Rm, Rp, and Rt are independently a non-hydrolyzable group (e.g., hydrogen atom, alkyl group, cycloalkyl group, alkenyl group, aryl group, or alkylsilyl group).

Examples of the alkyl group, the alkenyl group, and the aryl group include those mentioned above in connection with Rx and the like.

Examples of the cycloalkyl group include those mentioned above in connection with Rq and the like.

Examples of the alkylsilyl group include a trimethylsilyl group, a triethylsilyl group, a triisopropyisilyl group, a tri-t-butylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rm, Rp, and Rt. A hydrogen atom is particularly preferable as Rm, Rp, and Rt.

The polysilazane-based compound that includes the repeating unit represented by the formula (f) may be an inorganic polysilazane in which each of Rm, Rp, and Rt is a hydrogen atom, or an organic polysilazane in which at least one of Rm, Rp, and Rt is not a hydrogen atom.

Examples of the inorganic polysilazane include a perhydropolysilazane that has a linear structure that includes a repeating unit represented by the following formula, has a molecular weight of 690 to 2000, and includes three to ten $SiH_3$ groups in one molecule (see JP-B-63-16325),

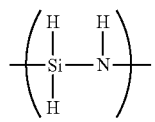

a perhydropolysilazane that has a linear structure and a branched structure, and includes a repeating unit represented by the following formula (A),

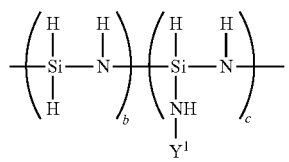

wherein b and c are arbitrary natural numbers, and $Y^1$ represents a hydrogen atom or a group represented by the following formula (B),

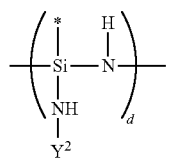

wherein d is an arbitrary natural number, * is a bonding position, and $Y^2$ is a hydrogen atom or a group represented by the formula (B), such as a perhydropolysilazane that has a linear structure, a branched structure, and a cyclic structure in the molecule, and includes the perhydropolysilazane structure represented by the following formula (C),

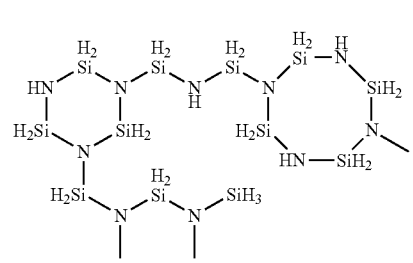

and the like.

Examples of the organic polysilazane include:

(i) a polysilazane that includes a repeating unit represented by -(Rm'SiHNH)— (wherein Rm' is an alkyl group, a cycloalkyl group, an alkenyl group, an aryl group, or an alkylsilyl group similar to those represented by Rm (hereinafter the same)), and has a cyclic structure having a degree of polymerization of 3 to 5;

(ii) a polysilazane that includes a repeating unit represented by -(Rm'SiHNRt')- (wherein Rt' is an alkyl group, a cycloalkyl group, an alkenyl group, an aryl group, or an alkylsilyl group similar to those represented by Rt), and has a cyclic structure having a degree of polymerization of 3 to 5;

(iii) a polysilazane that includes a repeating unit represented by -(Rm'Rp'SiNH)— (wherein Rp' is an alkyl group, a cycloalkyl group, an alkenyl group, an aryl group, or an alkylsilyl group similar to those represented by Rp), and has a cyclic structure having a degree of polymerization of 3 to 5;

(iv) a polyorgano(hydro)silazane that includes a structure represented by the following formula in the molecule;

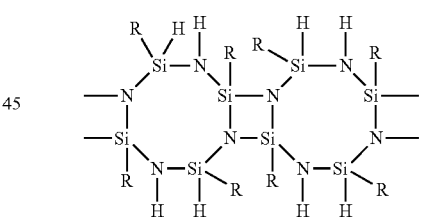

R = $CH_3$ (v) a polysilazane that includes a repeating unit represented by the following formula,

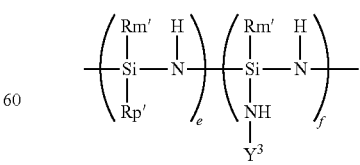

wherein Rm' and Rp' are the same as defined above, e and f are arbitrary natural numbers, and $Y^3$ is a hydrogen atom or a group represented by the following formula (D),

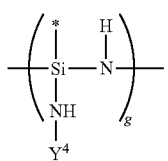

(D)

wherein g is an arbitrary natural number, * is a bonding position, and $Y^4$ is a hydrogen atom or the group represented by the formula (D); and the like.

The above organic polysilazanes may be produced by a known method. For example, the above organic polysilazanes may be produced by reacting ammonia or a primary amine with a reaction product of a secondary amine and a substituted or unsubstituted halogenosilane compound represented by the following formula.

$$R^1_{4-m}SiX_m$$

wherein m is 2 or 3, X is a halogen atom, and $R^1$ is a substituent that substitutes Rm, Rp, Rt, Rm', Rp', or Rt'.

The secondary amine, ammonia, and the primary amine may be appropriately selected depending on the structure of the target polysilazane-based compound.

A modified polysilazane may be used as the polysilazane-based compound. Examples of the modified polysilazane include a polymetallosilazane that includes a metal atom (which may be crosslinked), a polysiloxazane that includes a repeating unit represented by $(SiH_2)_j(NH)_h$ and a repeating unit represented by $(SiH_2)_iO$ (wherein j, h, and i are independently 1, 2, or 3) (see JP-A-62-195024), a polyborosilazane produced by reacting a polysilazane with a boron compound (see JP-A-2-84437), a polymetallosilazane produced by reacting a polysilazane with a metal alkoxide (see JP-A-63-81122, for example), an inorganic silazane polymer and a modified polysilazane (see JP-A-1-138108, for example), a copolymer silazane produced by introducing an organic component into a polysilazane (JP-A-2-175726, for example), a low-temperature ceramic polysilazane obtained by adding a ceramic-forming catalyst compound to a polysilazane (see JP-A-5-238827, for example), a silicon alkoxide-addition polysilazane (see JP-A-5-238827), a glycidol-addition polysilazane (see JP-A-6-122852), an acetylacetonato complex-addition polysilazane (see JP-A-6-306329), a metal carboxylate-addition polysilazane (see JP-A-6-299118, for example), a polysilazane composition produced by adding an amine and/or acid to the above polysilazane or modified polysilazane (see JP-A-9-31333), a modified polysilazane produced by adding an alcohol (e.g., methanol) or hexamethyldisilazane to the terminal nitrogen (N) atom of perhydropolysilazane (see JP-A-5-345826 and JP-A-4-63833), and the like.

The polysilazane-based compound used in connection with one embodiment of the invention is preferably an inorganic polysilazane in which each of Rm, Rp, and Rt is a hydrogen atom, or an organic polysilazane in which at least one of Rm, Rp, and Rt is not a hydrogen atom, and more preferably an inorganic polysilazane from the viewpoint of availability and a capability to form an implanted layer that exhibits an excellent gas barrier capability.

A product commercially available as a glass coating material or the like may be used directly as the polysilazane-based compound.

The low-refractive-index layer may include an additional component as long as the object of the invention is not impaired. Examples of the additional component include a curing agent, an aging preventive, a light stabilizer, a flame retardant, and the like.

When the low-refractive-index layer is the silicon-based polymer layer, the low-refractive-index layer may include a polymer other than the silicon-based polymer. The content of the silicon-based polymer compound in the low-refractive-index layer is preferably 50 mass % or more, and more preferably 70 mass % or more, based on the low-refractive-index layer, since an intermediate-refractive-index layer having the desired properties can be efficiently formed by an ion implantation treatment (e.g., plasma ion implantation treatment) described later.

The low-refractive-index layer may be formed using an arbitrary method. For example, the low-refractive-index layer may be formed by dissolving or dispersing the material for forming the low-refractive-index layer and an optional additional component in an appropriate solvent to prepare a low-refractive-index layer-forming solution, applying the low-refractive-index layer-forming solution to one side or each side of the base, drying the resulting film, and optionally applying heat or energy rays to the dried film.

When forming the intermediate-refractive-index layer and the low-refractive-index layer by subjecting the silicon-based polymer layer to an ion implantation treatment (e.g., plasma ion implantation treatment), part (surface layer part) of the silicon-based polymer layer is modified by the ion implantation treatment to form the intermediate-refractive-index layer, while the remaining part maintains a low refractive index, and serves as the low-refractive-index layer. Specifically, a low-refractive-index layer having a given thickness can be formed at the same time as the intermediate-refractive-index layer by subjecting the silicon-based polymer layer to an ion implantation treatment (e.g., plasma ion implantation treatment).

A spin coater, a knife coater, a gravure coater, or the like may be used as the coater for applying the low-refractive-index layer-forming solution.

The film formed by applying the low-refractive-index layer-forming solution may be dried using a known drying method such as hot-air drying, heat roll drying, or infrared irradiation. The heating temperature is normally 80 to 150° C., and the heating time is normally several tens of seconds to several tens of minutes.

Intermediate-Refractive-Index Layer

The intermediate-refractive-index layer used in connection with one embodiment of the invention is a layer having a refractive index of 1.50 to 1.80, preferably 1.55 to 1.75, and more preferably 1.60 to 1.70. A transparent conductive laminate that exhibits excellent optical properties (i.e., total light transmittance and color tone) and excellent heat resistance can be obtained by utilizing the intermediate-refractive-index layer having the above properties in combination with the low-refractive-index layer. If the refractive index of the intermediate-refractive-index layer is less than 1.50, a deterioration in moisture-heat resistance may occur. If the refractive index of the intermediate-refractive-index layer exceeds 1.80, a deterioration in optical properties and heat resistance may occur.

The intermediate-refractive-index layer used in connection with one embodiment of the invention has a film density of 2.5 to 4.5 g/cm$^3$, and preferably 2.7 to 3.5 g/cm$^3$. If the film density of the intermediate-refractive-index layer is less than 2.5 g/cm$^3$, the transparent conductive laminate may exhibits insufficient moisture-heat resistance. If the film density of the intermediate-refractive-index layer exceeds 4.5, the intermediate-refractive-index layer may exhibit insufficient flexibility, and cracks may occur during production or transportation of the transparent conductive laminate (i.e., moisture-heat resistance may deteriorate).

The film density may be calculated using X-ray reflectometry (XRR).

When X-rays are incident on a thin film formed on a substrate at a very low angle, the X-rays are totally reflected. When the incident angle of the X-rays is equal to or higher than the total reflection critical angle, the X-rays enter the inside of the thin film, and are divided into transmitted waves and reflected waves at the surface/interface of the thin film, and the reflected waves undergo interference. The film density can be determined by analyzing the total reflection critical angle. The thickness of the thin film can also be determined by performing measurement while changing the incident angle, and analyzing an interference signal of reflected waves due to a change in optical path difference.

The film density may be measured by the following method.

The refractive index n of a substance when applying X-rays, and the real part δ of the refractive index n are normally given by the following expressions (1) and (2).

$$n = 1 - \delta - i\beta \quad (1)$$

$$\delta = \left(\frac{r_e \lambda^2}{2\pi}\right) N_0 \rho \sum_i x_i(Z_i + f_i') / \sum_i x_i M_i \quad (2)$$

where, $r_e$ is the classical electron radius ($2.818 \times 10^{-15}$ m), $N_0$ is Avogadro's number, λ is the wavelength of X-rays, ρ is the density (g/cm³), Zi, Mi, and xi respectively are the atomic number, the atomic weight, and the atomic number ratio (molar ratio) of the ith atom, and fi' is the atomic scattering factor (abnormal dispersion term) of the ith atom. The total reflection critical angle θc is given by the following expression (3), provided that β that relates to absorption is disregarded.

$$\theta c = \sqrt{2\delta} \quad (3)$$

Therefore, the density ρ is calculated by the following expression 4 based on the relationship between the expressions (2) and (3).

$$\rho = \frac{\theta c^2 \sum_i x_i M_i}{\left(\frac{r_e \lambda^2}{\pi}\right) N_0 \sum_i x_i(Z_i + f_i')} \quad (4)$$

The total reflection critical angle $\theta c^2$ can be calculated from the X-ray reflectivity. The classical radius $r_e$, Avogadro's number $N_0$, and the wavelength λ are constants, and the atomic number Zi, the atomic weight Mi, and the atomic scattering factor fi' are inherent to the constituent atom. A value obtained by XPS measurement is used as the atomic number ratio xi (molar ratio).

The film density of the intermediate-refractive-index layer is measured using the method described in connection with the examples, and is determined using the expression (4).

The optical thickness of the intermediate-refractive-index layer is normally 1 to 100 nm, and preferably 10 to 50 nm. When the optical thickness of the intermediate-refractive-index layer is within the above range, it is possible to obtain a transparent conductive laminate that exhibits excellent optical properties, and has a reduced thickness.

The intermediate-refractive-index layer may include an arbitrary component, and may be formed using an arbitrary method as long as the intermediate-refractive-index layer has the above properties. A known material and a known method may be used to form the intermediate-refractive-index layer. Examples of the material for forming the intermediate-refractive-index layer include oxides such as aluminum oxide, magnesium oxide, and silicon oxide; nitrides such as silicon nitride; oxynitrides such as silicon oxynitride; and the like. It is preferable that the material for forming the intermediate-refractive-index layer include an oxygen atom and a silicon atom. When the intermediate-refractive-index layer includes an oxygen atom and a silicon atom, it is possible to easily form an intermediate-refractive-index layer that exhibits an excellent gas barrier capability.

The oxygen atom content ratio (the ratio of the number of oxygen atoms), the silicon atom content ratio (the ratio of the number of silicon atoms), and the nitrogen atom content ratio (the ratio of the number of nitrogen atoms) in the transparent conductive laminate are preferably 60 to 75%, 25 to 35%, and 0 to 10%, based on the total content rate of oxygen atoms, silicon atoms, and nitrogen atoms, from the viewpoint of the moisture-heat resistance and the optical properties of the transparent conductive laminate.

The intermediate-refractive-index layer may be formed directly using a physical or chemical deposition method (e.g., deposition (evaporation) method, sputtering method, ion plating method, thermal CVD method, or plasma CVD method). Note that the intermediate-refractive-index layer may be formed using a method that forms a layer having a specific chemical composition by utilizing an ion implantation treatment or the like. It is preferable to form the intermediate-refractive-index layer using a plasma ion implantation treatment since the intermediate-refractive-index layer can be easily formed.

When using the silicon-based polymer layer as the low-refractive-index layer, an intermediate-refractive-index layer having the above properties can be easily formed by subjecting the silicon-based polymer layer to a plasma ion implantation treatment.

Specifically, part (surface layer part) of the silicon-based polymer layer used as the low-refractive-index layer is modified by subjecting the silicon-based polymer layer to a plasma ion implantation treatment to form an intermediate-refractive-index layer having the above properties.

The plasma ion implantation treatment may be implemented using a known method.

When using the plasma ion implantation method, the ion implantation area can be changed, and the refractive index of the intermediate-refractive-index layer can be controlled by changing the ion implantation voltage. An intermediate-refractive-index layer having the desired refractive index can be easily formed by utilizing the ion implantation method.

Examples of the ions implanted into the low-refractive-index layer include ions of a rare gas such as argon, helium, neon, krypton, or xenon; ions of a fluorocarbon, hydrogen, nitrogen, oxygen, carbon dioxide, chlorine, fluorine, sulfur, or the like; ions of an alkane gas such as methane, ethane, propane, butane, pentane, and hexane; ions of an alkene gas such as ethylene, propylene, butene, and pentene; ions of an alkadiene gas such as pentadiene and butadiene; ions of an alkyne gas such as acetylene and methylacetylene; ions of an aromatic hydrocarbon gas such as benzene, toluene, xylene, indene, naphthalene, and phenanthrene; ions of a cycloalkane gas such as cyclopropane and cyclohexane; ions of a cycloalkene gas such as cyclopentene and cyclohexene; ions of conductive metals such as gold, silver, copper, platinum, nickel, palladium, chromium, titanium, molybdenum, niobium, tantalum, tungsten, and aluminum; ions of silane ($SiH_4$) or an organosilicon compound; and the like.

Examples of the organosilicon compounds include tetraalkoxysilanes such as tetramethoxysilane, tetraethoxysilane, tetra-n-propoxysilane, tetraisopropoxysilane, tetra-n-butoxysilane, and tetra-t-butoxysilane; substituted or unsubstituted alkylalkoxysilanes such as dimethyldimethoxysilane, dimethyldiethoxysilane, diethyldimethoxysilane, methyltriethoxysilane, ethyltrimethoxysilane, and (3,33-trifluoropropyl)trimethoxysilane; arylalkoxysilanes such as diphenyldimethoxysilane and phenyltriethoxysilane; disiloxanes such as hexamethyldisiloxane (HMDSO); aminosilanes such as bis(dimethylamino)dimethylsilane, bis(dimethylamino)methylvinylsilane, bis(ethylamino) dimethylsilane, diethylaminotrimethylsilane, dimethylaminodimethylsilane, tetrakisdimethylaminosilane, and tris(dimethylamino)silane; silazanes such as hexamethyldisilazane, hexamethylcyclotrisilazane, heptamethyldisilazane, nonamethyltrisilazane, octamethylcyclotetrasilazane, and tetramethyldisilazane; cyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, tetramethylsilane, tris(trimethylsilyl) methane, tris(trimethylsilyl)silane, and benzyltrimethylsilane; silylalkynes such as bis(trimethylsilyl)acetylene, trimethylsilylacetylene, and 1-(trimethylsilyl)-1-propyne; silylalkenes such as 1,4-bistrimethylsilyl-1, 3-butadiyne and cyclopentadienyltrimethylsilane; arylalkylsilanes such as phenyldimethylsilane and phenyltrimethylsilane; alkynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like.

These compounds (ions) may be used either alone or in combination.

It is preferable to use ions of at least one element selected from the group consisting of hydrogen, nitrogen, oxygen, argon, helium, neon, xenon, and krypton from the viewpoint of ease of implantation and a capability to form an intermediate-refractive-index layer that exhibits a particularly excellent gas barrier capability, and has the desired optical properties.

The ions may be implanted using an arbitrary method. For example, the ions may be implanted by applying ions (ion beams) accelerated by an electric field, implanting ions present in plasma (plasma ion implantation method), or the like. It is preferable to use the plasma ion implantation method since an intermediate-refractive-index layer having the desired properties can be easily formed.

It is preferable to use a plasma ion implantation method (A) that implants ions present in plasma generated by utilizing an external electric field into the surface area of the silicon-based polymer layer, or a plasma ion implantation method (B) that implants ions present in plasma generated due to an electric field produced by applying a negative high-voltage pulse to the silicon-based polymer layer into the surface area of the silicon-based polymer layer.

When using the plasma ion implantation method (A), it is preferable to set the ion implantation pressure (plasma ion implantation pressure) to 0.01 to 1 Pa. When the ion implantation pressure is within the above range, ions can be easily, efficiently, and uniformly implanted, and the desired intermediate-refractive-index layer can be efficiently formed.

The plasma ion implantation method (B) has advantages in that it is unnecessary to increase the degree of decompression, the operation is simple, and the processing time can be significantly reduced. Moreover, the entire silicon-based polymer layer can be uniformly treated, and ions present in the plasma can be continuously implanted into the surface area of the silicon-based polymer layer with high energy by applying a negative high-voltage pulse. The plasma ion implantation method (B) also has an advantage in that an excellent ion-implanted layer can be uniformly formed in the surface area of the silicon-based polymer layer by merely applying a negative high-voltage pulse to the silicon-based polymer layer without requiring a special means such as a high-frequency power supply (e.g., radio frequency (RF) power supply or microwave power supply).

When using the plasma ion implantation method (A) or (B), the pulse width when applying a negative high-voltage pulse (i.e., during ion implantation) is preferably 1 to 15 μsec. When the pulse width is within the above range, ions can be easily, efficiently, and uniformly implanted.

The applied voltage when generating plasma is preferably −1 to −50 kV, more preferably −1 to −30 kV, and particularly preferably −5 to −20 kV. If the applied voltage is higher than −1 kV, the ion implantation dose may be insufficient, and the desired performance may not be obtained. If the applied voltage is lower than −50 kV, the film may be charged during ion implantation, or coloration or the like of the film may occur.

Examples of the ion species used for plasma ion implantation include those mentioned above.

A plasma ion implantation apparatus is used when implanting ions present in plasma into the surface area of the silicon-based polymer layer.

Specific examples of the plasma ion implantation apparatus include (α) an plasma ion implantation apparatus that causes the silicon-based polymer layer (hereinafter may be referred to as "ion implantation target layer") to be evenly enclosed by plasma by superimposing high-frequency electric power on a feed-through that applies a negative high-voltage pulse to the ion implantation target layer so that ions present in the plasma are attracted to and collide with the target, and thereby implanted and deposited therein (JP-A-2001-26887), (β) an plasma ion implantation apparatus that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) an plasma ion implantation apparatus that generates plasma using an external electric field utilizing a high-frequency electric power supply such as a microwave power supply, and causes ions present in the plasma to be attracted to and implanted into the target by applying a high-voltage pulse, (δ) an plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a simple operation, significantly reduces the treatment time, and can be continuously used.

Examples of a method that utilizes the plasma ion implantation apparatus (γ) or (δ) include the method disclosed in WO2010/021326.

Since the plasma ion implantation apparatus (γ) or (δ) is configured so that the high-voltage pulse power supply is used as a plasma generation means that generates plasma, plasma can be generated, and ions present in the plasma can be continuously implanted into the surface area of the polymer layer by merely applying a negative high-voltage pulse to the polymer layer without requiring a special means such as a high-frequency power supply (e.g., RF power supply or microwave power supply), and a film in which a silicon-based polymer layer having a surface area modified by ion implantation (i.e., intermediate-refractive-index layer) is formed can be mass-produced.

Whether or not ions have been implanted may be determined by performing elemental analysis on the surface area of the polymer layer up to a depth of about 10 nm using X-ray photoelectron spectroscopy (XPS).

Transparent Conductive Layer

The transparent conductive layer used in connection with one embodiment of the invention is a transparent thin layer that exhibits electrical conductivity.

The transparent conductive layer normally has an optical thickness of 10 to 300 nm, preferably 10 to 250 nm, more preferably 50 to 250 nm, and still more preferably 100 to 200 nm. When the optical thickness of the transparent conductive layer within the above range, it is possible to obtain a transparent conductive laminate that exhibits excellent optical properties, and has a reduced thickness.

A known transparent conductive layer used for an electronic member or an optical member may be used as the transparent conductive layer.

Examples of a material for forming the transparent conductive layer include metals, alloys, metal oxides, electrically conductive compounds, mixtures thereof, and the like. Specific examples of the material for forming the transparent conductive layer include conductive metal oxides such as tin oxide, antimony-doped tin oxide (ATO), fluorine-doped tin oxide (FTO), zinc oxide, gallium-doped zinc oxide (GZO), aluminum-doped zinc oxide (AZO), indium oxide, indium tin oxide (ITO), and indium zinc oxide (IZO); metals such as gold, silver, chromium, and nickel; mixtures of a metal and a conductive metal oxide; inorganic conductive substances such as copper iodide and copper sulfide; organic conductive materials such as polyaniline, polythiophene, and polypyrrole; and the like. Among these, conductive metal oxides are preferable from the viewpoint of electrical conductivity, zinc oxide-based conductive materials such as gallium-doped zinc oxide (GZO), aluminum-doped zinc oxide (AZO), and indium zinc oxide (IZO) are more preferable from the viewpoint of reducing the amount of rare metal used, and achieving environmentally-friendly product design, gallium-doped zinc oxide (GZO) is still more preferable from the viewpoint of durability and material cost, and zinc oxide to which digallium trioxide is added in a ratio of 1 to 10% is particularly preferable from the viewpoint of electrical conductivity.

The transparent conductive layer may be a laminate that includes a plurality of layers formed of these materials.

The transparent conductive layer may be formed using a deposition (evaporation) method, a sputtering method, an ion plating method, a thermal CVD method, a plasma CVD method, or the like. It is preferable to form the transparent conductive layer using a sputtering method since the conductive layer can be easily formed.

When forming the transparent conductive layer using a sputtering method, a discharge gas (e.g., argon) is introduced into a vacuum chamber. A high-frequency voltage or a direct-current voltage is applied between a target and a substrate to generate plasma, and the plasma is allowed to collide with the target so that the target material adheres to the substrate to obtain a thin film. The target is formed of the material for forming the transparent conductive layer (see above).

Transparent Conductive Laminate

A transparent conductive laminate according to one embodiment of the invention has a configuration in which the low-refractive-index layer, the intermediate-refractive-index layer, and the transparent conductive layer are sequentially stacked on at least one side of the base either directly or through one or more layers.

The transparent conductive laminate according to one embodiment of the invention may include an additional layer other than the above layers. Examples of the additional layer include an undercoat layer that is provided between the base and the low-refractive-index layer, and the like.

A transparent conductive laminate in which the base and the low-refractive-index layer exhibit excellent adhesion can be easily obtained by providing the undercoat layer.

The undercoat layer may be formed using an arbitrary material. A known material may be used to form the undercoat layer. Examples of the material for forming the undercoat layer include silicon-containing compounds; photopolymerizable compositions that include a photopolymerizable compound produced using a photopolymerizable monomer and/or a photopolymerizable prepolymer, and a photoinitiator; resins such as a polyester-based resin, a polyurethane-based resin (particularly a two-component curable resin that includes an isocyanate compound and a polyacrylic polyol, a polyester polyol, a polyether polyol, or the like), an acrylic-based resin, a polycarbonate-based resin, a vinyl chloride/vinyl acetate copolymer, a polyvinyl butyral-based resin, and a nitrocellulose-based resin; alkyl titanates; ethyleneimine; and the like. These materials may be used either alone or in combination.

The undercoat layer may be formed by dissolving or dispersing the above material in an appropriate solvent to prepare an undercoat layer-forming solution, applying the undercoat layer-forming solution to one side of the base, drying the resulting film, and optionally applying energy rays to the dried film.

The undercoat layer-forming solution may be applied to the base using a normal wet coating method. Examples of the wet coating method include a dipping method, a roll coating method, a gravure coating method, a knife coating method, an air knife coating method, a roll knife coating method, a die coating method, a screen printing method, a spray coating method, a gravure offset method, and the like.

The film formed by applying the undercoat layer-forming solution may be dried using a known drying method such as hot-air drying, heat roll drying, or infrared irradiation.

Energy rays generated by various energy ray generation apparatuses are used as the energy rays applied to the dried film. For example, ultraviolet rays emitted from a UV lamp are normally used as ultraviolet rays. A UV lamp (e.g., high-pressure mercury lamp, fusion H lamp, or xenon lamp)

that emits ultraviolet rays having a spectral distribution in a wavelength region of 300 to 400 nm is normally used as the UV lamp. The dose is preferably 50 to 3000 mJ/cm$^2$.

The thickness of the undercoat layer is preferably 0.05 to 20 μm, more preferably 0.1 to 10 μm, and still more preferably 0.5 to 5 μm.

The refractive index of the undercoat layer is normally 1.4 to 1.7, and preferably 1.4 to 1.6. When the refractive index of the undercoat layer is within the above range, it is possible to easily obtain a transparent conductive laminate that exhibits excellent transparency, has reduced yellowness, and exhibits excellent optical properties.

The transparent conductive laminate according to one embodiment of the invention has low surface resistivity. For example, the surface resistivity of the transparent conductive laminate is preferably 1000 Ω/square or less, and more preferably 100 to 600 Ω/square. When the surface resistivity of the transparent conductive laminate is within the above range, it is possible to obtain a transparent conductive laminate that is suitable for a capacitance-type touch panel.

The transparent conductive laminate according to one embodiment of the invention exhibits excellent moisture-heat resistance. Specifically, the transparent conductive laminate according to one embodiment of the invention shows a small change in surface resistivity when the transparent conductive laminate is allowed to stand under moisture-heat conditions.

More specifically, when the surface resistivity of the transparent conductive laminate before the transparent conductive laminate is allowed to stand under moisture-heat conditions is referred to as $R_0$, and the surface resistivity of the transparent conductive laminate after the transparent conductive laminate has been allowed to stand at a temperature of 60° C. and a relative humidity of 90% RH for 7 days is referred to as $R_1$, the transparent conductive laminate has a small surface resistivity increase ratio T given by the following expression.

$$T=R_1/R_0$$

For example, the increase ratio T is preferably less than 1.5, and more preferably 1.0 or more and less than 1.2.

The surface resistivity of the transparent conductive laminate may be measured using a known method (e.g., four-terminal four-probe constant-current application method).

The fact that the transparent conductive laminate according to one embodiment of the invention exhibits excellent moisture-heat resistance is also demonstrated by the fact that a laminate used to produce the transparent conductive laminate according to one embodiment of the invention immediately after forming the intermediate-refractive-index layer (i.e., a laminate before forming the transparent conductive layer) has a very low gas (e.g., water vapor) transmission rate.

For example, the water vapor transmission rate of the laminate at a temperature of 40° C. and a relative humidity of 90% is preferably 0.1 g/m$^2$/day or less, and more preferably 0.001 to 0.05 g/m$^2$/day.

Since the transparent conductive laminate according to one embodiment of the invention is produced using the laminate having the above properties, the transparent conductive laminate according to one embodiment of the invention has a low gas (e.g., water vapor) transmission rate. For example, the water vapor transmission rate of the transparent conductive laminate according to one embodiment of the invention at a temperature of 40° C. and a relative humidity of 90% is preferably 0.1 g/m$^2$/day or less, and more preferably 0.001 to 0.05 g/m$^2$/day.

The water vapor transmission rate may be measured using a known gas transmission rate measurement device.

The transparent conductive laminate according to one embodiment of the invention exhibits excellent transparency. Specifically, the transparent conductive laminate according to one embodiment of the invention has a high total light transmittance. For example, the total light transmittance of the transparent conductive laminate according to one embodiment of the invention is preferably 80% or more, more preferably 80 to 95%, and still more preferably 85 to 90%.

The total light transmittance may be measured using a known total light transmittance measurement device.

The transparent conductive laminate according to one embodiment of the invention has a natural color tone in which yellowness is suppressed. Specifically, the transparent conductive laminate according to one embodiment of the invention has a small absolute value of the transmission hue b* value. For example, the transmission hue b* value of the transparent conductive laminate according to one embodiment of the invention is preferably −2.0 to +2.0, more preferably −1.5 to +1.5, and still more preferably −1.0 to +1.0.

Since the transparent conductive laminate according to one aspect of the invention has the above properties, the transparent conductive laminate is suitable as an electronic member (e.g., electrode) used for an electronic device or module of image displays such as a liquid crystal display, an electroluminescence (EL) display, and a touch panel.

EXAMPLES

The invention is further described below by way of examples. Note that the invention is not limited to the following examples.

The content rate of oxygen atoms, nitrogen atoms, and silicon atoms, the film density, the refractive index, the thickness, the water vapor transmission rate, the surface resistivity of the transparent conductive laminate, the total light transmittance, the transmission hue b* value of the transparent conductive laminate, the moisture-heat resistance, and the optical properties were measured or evaluated using the following methods.

Measurement of Content Rate of Oxygen Atoms, Nitrogen Atoms, and Silicon Atoms

The content rate of oxygen atoms, nitrogen atoms, and silicon atoms in the surface area of the intermediate-refractive-index layer (i.e., a layer obtained by ion implantation) was measured under the following measurement conditions using an X-ray photoelectron spectrometer.

Measuring apparatus: "PHI Quantera SXM" manufactured by ULVAC-PHI, Incorporated
X-ray source: AlKα
X-ray beam diameter: 100 μm
Electric power: 25 W
Voltage: 15 kV
Take-off angle: 45°
Degree of vacuum: 5.0×10$^{-8}$ Pa Measurement of Film Density The X-ray reflectance was measured under the following measurement conditions to determine the total reflection critical angle θc, and the film density of the intermediate-refractive-index layer was calculated from the total reflection critical angle θc.

The following measurement apparatus and measurement conditions were used.

Measurement apparatus: X-ray diffractometer "SmartLab" (manufactured by Rigaku Corporation)
Measurement Conditions
X-ray source: Cu-Kα1 (wavelength: 1.54059 Å)
Optical system: parallel-beam optical system
Incident-side slit system: Ge(220)2 crystal, height-limiting slit: 5 mm, incident slit: 0.05 mm
Receiving-side slit system: receiving slit: 0.10 mm, solar slit: 5°
Detector: scintillation counter
Tube voltage-tube current: 45 kV-200 mA
Scan axis: 2θ/θ
Scan mode: continuous scan
Scan range: 0.1 to 3.0 deg.
Scan speed: 1 deg./min
Sampling interval: 0.002°/step The content rate of oxygen atoms, nitrogen atoms, and silicon atoms in the intermediate-refractive-index layer measured by X-ray photoelectron spectroscopy was used for the atomic number ratio (xi).

Measurement of Refractive Index and Thickness

The refractive index and the thickness of each layer were measured using a spectroscopic ellipsometer ("M-2000U" manufactured by J. A. Woollam).

Measurement of Water Vapor Transmission Rate

The water vapor transmission rate was measured using a water vapor transmission rate measurement apparatus ("PERMATRAN-W3/33" manufactured by MOCON) at a temperature of 40° C. and a relative humidity of 90%.

Measurement of Surface Resistivity of Transparent Conductive Laminate

The surface resistivity of the transparent conductive laminate was measured at a temperature of 23° C. and a relative humidity of 50% using LORESTA-GP MCP-T600 (manufactured by Mitsubishi Chemical Corporation) (probe: "PROBE TYPE ASP" manufactured by Mitsubishi Chemical Analytech Co., Ltd.).

Measurement of Total Light Transmittance

The total light transmittance of the transparent conductive laminate was measured in accordance with JIS K 7631-1 using a haze meter ("HAZE METER NDH5000" manufactured by Nippon Denshoku Industries Co., Ltd.).

Measurement of Transmission Hue b* Value of Transparent Conductive Laminate

The transmission hue b* value (i.e., the b* axis value in the CIE 1976 L*a*b* color system) of the transparent conductive laminate was measured in accordance with JIS K 7105 using a spectral color-difference meter ("Spectro Color Meter SQ2000" manufactured by Nippon Denshoku Industries Co., Ltd.).

Note that the b* value is calculated by the following expression.

$$b^* = 200[(Y/Yn)^{1/3} - (Z/Zn)^{1/3}]$$

where, Y and Z are tristimulus values (in the XYZ coordinate system) of the sample measured using a color difference meter, and Yn and Zn are tristimulus values at the perfect reflecting diffuser.

(1) Evaluation of Moisture-Heat Resistance

The surface resistivity of the transparent conductive laminate was measured in the same manner as described above to obtain an initial value ($R_0$). After allowing the transparent conductive laminate to stand at a temperature of 60° C. and a relative humidity of 90% RH for 7 days, the surface resistivity of the transparent conductive laminate was measured in the same manner as described above to obtain a value ($R_1$) after the transparent conductive laminate was subjected to the moisture-heat conditions. The surface resistivity increase ratio T given by the following expression was calculated, and the moisture-heat resistance was evaluated in accordance with the following standard.

$$T = R_1/R_0$$

Acceptable: The surface resistivity increase ratio T was less than 1.2.
Fair: The surface resistivity increase ratio T was 1.2 or more and less than 1.5.
Unacceptable: The surface resistivity increase ratio T was 1.5 or more.

(2) Evaluation of Optical Properties

The total light transmittance and the transmission hue b* value were measured in the same manner as described above, and the optical properties were evaluated in accordance with the following standard.

Acceptable: The total light transmittance was 85% or more, and the absolute value of the transmission hue b* value was 1.0 or less.
Fair: The total light transmittance was 80% or more and less than 85%, and the absolute value of the transmission hue b* value was 1.0 or less, or the total light transmittance was 85% or more, and the absolute value of the transmission hue b* value was more than 1.0 and 2.0 or less.
Unacceptable: The total light transmittance was less than 80%, or the absolute value of the transmission hue b* value was more than 2.0.

Production Example 1 (Preparation of Undercoat Layer-Forming Solution)

5.78 g (42.5 mmol) of trimethoxymethylsilane (manufactured by AZMAX) and 1.77 g (7.5 mmol) of 3-methacryloxypropyltriethoxysilane ("KBM-503" manufactured by Shin-Etsu Chemical Co., Ltd.) were dissolved in 50 ml of ethyl acetate. After the addition of 25 ml of distilled water, the mixture was stirred. After the addition of a few drops of phosphoric acid (catalyst), the mixture was stirred at room temperature for 18 hours.

After the addition of a saturated sodium hydrogen carbonate aqueous solution to neutralize the mixture, the aqueous layer was removed, and the resulting organic layer was dried over magnesium sulfate. After separating magnesium sulfate by filtration, the filtrate was concentrated under reduced pressure, and purified with n-hexane using a reprecipitation method.

After dissolving the purified product in ethyl acetate, 2,4,6-trimethylbenzoyldiphenylphosphine oxide ("Lucirin (registered trademark) TPO" manufactured by BASF) (photoinitiator) (1 mass % based on the solid) and 1-hydroxycyclohexyl phenyl ketone (photoinitiator) (2 wt % based on the solid) were added to the solution to prepare an undercoat layer-forming solution.

Example 1

The undercoat layer-forming solution obtained in Production Example 1 was applied to a polyester film ("Cosmoshine PETA4300" manufactured by Toyobo Co., Ltd., thickness: 100 µm), and heated at 120° C. for 1 minute. UV rays were applied to the undercoat layer-forming solution (high-pressure mercury lamp, line speed: 20 m/min, cumulative intensity: 100 mJ/cm$^2$, peak intensity 1.466 W, pass count: 2) using a UV-ray irradiation line to form an undercoat layer (thickness: 1100 nm, refractive index: 1.49, optical thickness: 1639 nm).

A perhydropolysilazane solution (Aquamica NL110A-20) was applied to the undercoat layer, and heated at 120° C. for 1 minute to form a silicon-based polymer layer (thickness: 150 nm, refractive index: 1.45, optical thickness: 218 nm).

Ar ions were implanted into the surface of the silicon-based polymer layer using a plasma ion implantation apparatus to modify part of the silicon-based polymer layer to form an intermediate-refractive-index layer (surface layer part) and a low-refractive-index layer (unmodified part). The low-refractive-index layer had a thickness of 120 nm, a refractive index of 1.45, and an optical thickness of 170 nm, and the intermediate-refractive-index layer had a film density of 2.76 g/cm$^3$, a thickness of 30 nm, a refractive index of 1.59, and an optical thickness of 48 nm.

The following plasma ion implantation apparatus and ion implantation conditions were used.
Plasma Ion Implantation Apparatus
RF power supply: "RF56000" manufactured by JEOL Ltd.
High-voltage pulsed power supply: "PV-3-HSHV-0835" manufactured by Kurita Seisakusho Co., Ltd.
Plasma Ion Implantation Conditions
Plasma-generating gas: Ar
Gas flow rate: 100 sccm
Duty ratio: 0.5%
Repetition frequency: 1000 Hz
Applied voltage: −6 kV
RF power supply: frequency: 13.56 MHz, applied electric power: 1000 W
Chamber internal pressure: 0.2 Pa
Pulse width: 5 μsec
Ion implantation time: 5 minutes
Line (transfer) speed: 0.2 m/min A transparent conductive layer (thickness: 92 nm, refractive index: 1.81, optical thickness: 167 nm) was formed on the intermediate-refractive-index layer by a DC magnetron sputtering method using a zinc oxide target material including 5.7 mass % of $Ga_2O_3$ to produce a transparent conductive laminate 1.

Table 1 shows the properties and the evaluation results of the transparent conductive laminate 1.

The transparent conductive layer was formed under the following conditions.
Substrate temperature: room temperature
DC output: 500 W
Carrier gas: argon The water vapor transmission rate in a state in which the transparent conductive layer was not formed was 0.01 g/m$^2$/day or less.

Example 2

A transparent conductive laminate 2 was produced in the same manner as in Example 1, except that a transparent conductive layer having a thickness of 110 nm, a refractive index of 1.81, and an optical thickness of 199 nm was formed. Table 1 shows the properties and the evaluation results of the transparent conductive laminate 2.

Example 3

A transparent conductive laminate 3 was produced in the same manner as in Example 1, except that the applied voltage during ion implantation was set to −10 kV, and a low-refractive-index layer having a thickness of 100 nm, a refractive index of 1.45, and an optical thickness of 145 nm, and an intermediate-refractive-index layer having a film density of 3.32 g/cm$^3$, a thickness of 35 nm, a refractive index of 1.66, and an optical thickness of 58 nm were formed. Table 1 shows the properties and the evaluation results of the transparent conductive laminate 3.

The water vapor transmission rate in a state in which the transparent conductive layer was not formed was 0.01 g/m$^2$/day or less.

Example 4

A transparent conductive laminate 4 was produced in the same manner as in Example 3, except that a transparent conductive layer having a thickness of 110 nm, a refractive index of 1.81, and an optical thickness of 199 nm was formed. Table 1 shows the properties and the evaluation results of the transparent conductive laminate 4.

Example 5

A transparent conductive laminate 5 was produced in the same manner as in Example 1, except that the applied voltage during ion implantation was set to −15 kV, and a low-refractive-index layer having a thickness of 100 nm, a refractive index of 1.45, and an optical thickness of 145 nm, and an intermediate-refractive-index layer having a film density of 4.45 g/cm$^3$, a thickness of 53 nm, a refractive index of 1.78, and an optical thickness of 94 nm were formed. Table 1 shows the properties and the evaluation results of the transparent conductive laminate 5.

Example 6

A transparent conductive laminate 6 was produced in the same manner as in Example 1, except that a transparent conductive layer (thickness: 112 nm, refractive index: 2.00, optical thickness: 224 nm) was formed on the intermediate-refractive-index layer by a DC magnetron sputtering method using an indium oxide target material including 10 mass % of $SnO_2$ (manufactured by Sumitomo Metal Mining Co., Ltd.). Table 1 shows the properties and the evaluation results of the transparent conductive laminate 6.

In Example 6, the transparent conductive layer was formed under the following conditions.
Substrate temperature: room temperature
DC output: 500 W
Carrier gas: argon+oxygen (oxygen flow rate ratio: 2%)

Comparative Example 1

A transparent conductive laminate 7 was produced in the same manner as in Example 1, except that plasma ion implantation was not performed. Table 1 shows the properties and the evaluation results of the transparent conductive laminate 7. In Comparative Example 1, an area of the silicon-based polymer layer up to a depth of 30 nm from the surface coming in contact with the transparent conductive layer (i.e., an area corresponding to the intermediate-refractive-index layer in Examples 1 to 6) was considered to be a surface layer part (intermediate-refractive-index layer), and the remaining area was considered to be a low-refractive-index layer. These areas were respectively listed in Table 1 as the intermediate-refractive-index layer (film density: 2.2 g/cm$^3$, thickness: 30 nm, refractive index: 1.45, optical thickness: 44 nm) and the low-refractive-index layer (refractive index: 1.45, optical thickness: 218 nm).

TABLE 1

|  |  | Example | | | | | | Comparative Example |
| --- | --- | --- | --- | --- | --- | --- | --- | --- |
|  |  | 1 | 2 | 3 | 4 | 5 | 6 | 1 |
| Transparent conductive laminate | | 1 | 2 | 3 | 4 | 5 | 6 | 7 |
| Low-refractive-index layer | Refractive index | 1.45 | 1.45 | 1.45 | 1.45 | 1.45 | 1.45 | 1.45 |
|  | Optical thickness (nm) | 170 | 170 | 145 | 145 | 145 | 170 | 218 |
| Intermediate-refractive-index layer | Film density (g/cm$^3$) | 2.76 | 2.76 | 3.32 | 3.32 | 4.45 | 2.76 | 2.20 |
|  | Refractive index | 1.59 | 1.59 | 1.66 | 1.66 | 1.78 | 1.59 | 1.45 |
|  | Optical thickness (nm) | 48 | 48 | 58 | 58 | 94 | 48 | 44 |
| Transparent conductive layer | Material | GZO | GZO | GZO | GZO | GZO | ITO | GZO |
|  | Refractive index | 1.81 | 1.81 | 1.81 | 1.81 | 1.81 | 2.00 | 1.81 |
|  | Optical thickness (nm) | 167 | 199 | 167 | 199 | 167 | 224 | 167 |
| Surface resistivity | Initial $R_0$ (Ω/square) | 133 | 105 | 133 | 104 | 133 | 40 | 140 |
|  | $R_1$ after subjecting to moisture-heat conditions (Ω/square) | 160 | 126 | 146 | 114 | 186 | 42 | 350 |
|  | Increase ratio T | 1.20 | 1.20 | 1.10 | 1.10 | 1.40 | 1.05 | 2.50 |
|  | Evaluation of moisture-heat resistance | Fair | Fair | Acceptable | Acceptable | Fair | Acceptable | Unacceptable |
| Optical properties | Total light transmittance | 81 | 84 | 83 | 86 | 85 | 86 | 80 |
|  | Transmission hue b* value | −0.8 | −1.0 | −1.0 | 0.6 | 1.0 | 1.4 | −0.3 |
|  | Evaluation of optical properties | Fair | Fair | Fair | Acceptable | Acceptable | Fair | Fair |

The following were confirmed from the results shown in Table 1.

The transparent conductive laminates 1 to 6 of Examples 1 to 6 exhibited excellent moisture-heat resistance, had a high total light transmittance and a small absolute value of the transmission hue b* value, shows suppressed yellowness, and exhibited excellent optical properties.

Since the film density and the refractive index of the intermediate-refractive-index layer included in the transparent conductive laminate 7 of Comparative Example 1 were too low, the transparent conductive laminate 7 exhibited poor moisture-heat resistance, and had a total light transmittance as low as 80%.

The invention claimed is:

1. A transparent conductive laminate comprising a base, a low-refractive-index layer, an intermediate-refractive-index layer, and a transparent conductive layer, the low-refractive-index layer, the intermediate-refractive-index layer, and the transparent conductive layer being sequentially stacked on at least one side of the base either directly or through one or more layers, the low-refractive-index layer having a refractive index of 1.40 to 1.50, and the intermediate-refractive-index layer having a refractive index of 1.50 to 1.80 and a film density of 2.5 to 4.5 g/cm$^3$, wherein the intermediate-refractive-index layer and the low-refractive-index layer are obtained by subjecting a silicon-based polymer layer to an ion implantation treatment.

2. The transparent conductive laminate according to claim 1, wherein the intermediate-refractive-index layer has an optical thickness of 1 to 100 nm.

3. The transparent conductive laminate according to claim 1, wherein the low-refractive-index layer has an optical thickness of 10 to 800 nm.

4. The transparent conductive laminate according to claim 1, wherein the transparent conductive layer has an optical thickness of 10 to 250 nm.

5. The transparent conductive laminate according to claim 1, the transparent conductive laminate having a water vapor transmission rate at a temperature of 40° C. and a relative humidity of 90% of 0.1 g/m$^2$/day or less.

6. The transparent conductive laminate according to claim 1, the transparent conductive laminate having a transmission hue b* value of −2.0 to +2.0 and a total light transmittance of 80% or more.

7. The transparent conductive laminate according to claim 1, wherein a material that forms the transparent conductive layer is at least one material selected from a group consisting of zinc oxide, gallium-doped zinc oxide (GZO), aluminum-doped zinc oxide (AZO), and indium zinc oxide (IZO).

8. An electronic device or module comprising the transparent conductive laminate according to claim 1.

9. An electronic device or module comprising the transparent conductive laminate according to claim 2.

10. An electronic device or module comprising the transparent conductive laminate according to claim 3.

11. An electronic device or module comprising the transparent conductive laminate according to claim 4.

12. An electronic device or module comprising the transparent conductive laminate according to claim 5.

13. An electronic device or module comprising the transparent conductive laminate according to claim 6.

* * * * *